Figure 3:
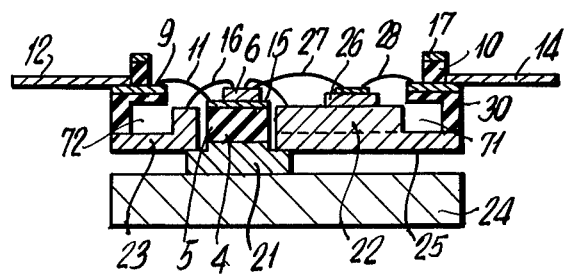

United States Patent [19]

Tsuzuki et al.

[11] 4,172,261
[45] Oct. 23, 1979

[54] SEMICONDUCTOR DEVICE HAVING A HIGHLY AIR-TIGHT PACKAGE

[75] Inventors: Naobumi Tsuzuki; Shinzo Anazawa, both of Tokyo, Japan

[73] Assignee: Nippon Electric Co., Ltd., Tokyo, Japan

[21] Appl. No.: 868,458

[22] Filed: Jan. 10, 1978

[30] Foreign Application Priority Data

Jan. 10, 1977 [JP] Japan .................................. 52-1687

[51] Int. Cl.² .................... H01L 23/02; H01L 39/02; H01L 23/12
[52] U.S. Cl. ........................ 357/81; 357/74; 357/80; 333/246; 333/247
[58] Field of Search ........................... 357/74, 80, 81; 333/84 M, 246, 247

[56] References Cited

U.S. PATENT DOCUMENTS

| | | | |
|---|---|---|---|
| 3,936,864 | 2/1976 | Benjamin | 357/81 |
| 3,946,428 | 3/1976 | Anazawa et al. | 357/81 |
| 4,042,952 | 8/1977 | Kraybill | 357/80 |

*Primary Examiner*—Andrew J. James
*Attorney, Agent, or Firm*—Hopgood, Calimafde, Kalil, Blaustein & Lieberman

[57] ABSTRACT

A semiconductor device is provided with a metal header of a size sufficiently small such that only a semiconductor element holding plate which requires heat dissipation can be mounted thereon. The metal header supports at its upper fringe portion an apertured member having a penetrating opening sealed along the opening. An insulative outer frame having a thermal expansion coefficient of the same order as that of the apertured member is supported on the peripheral portion of the apertured member. A lid member for hermetic sealing is bonded onto the outer frame.

16 Claims, 7 Drawing Figures

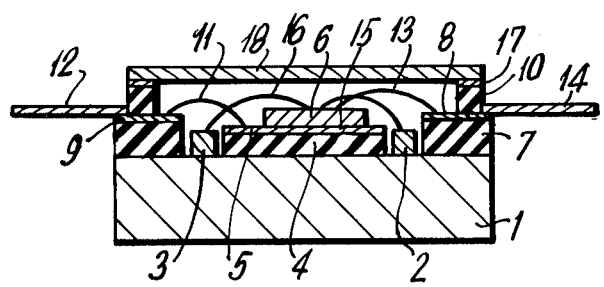
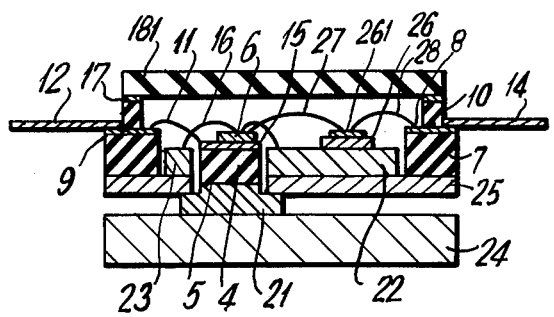
FIG.1A
PRIOR ART
FIG.2A
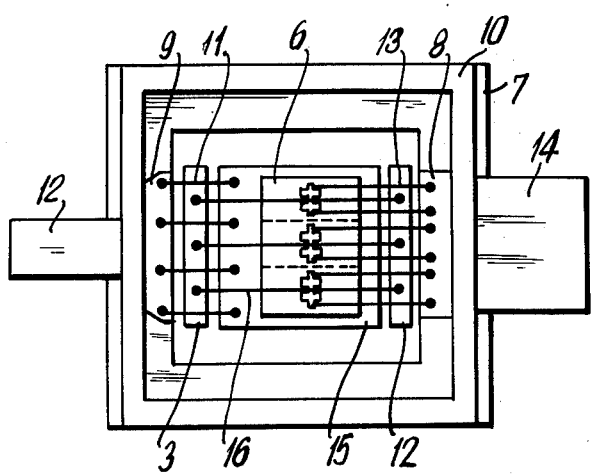
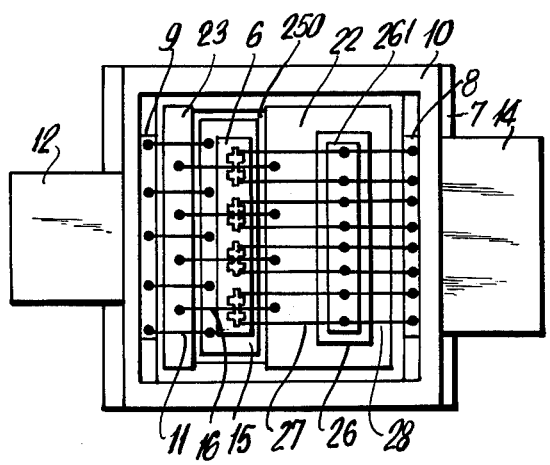
FIG.1B
PRIOR ART
FIG.2B

SEMICONDUCTOR DEVICE HAVING A HIGHLY AIR-TIGHT PACKAGE

The present invention relates to a semiconductor device and more particularly, to a hermetically sealed package that is suitable for mounting a high-frequency high-power semiconductor element.

In prior designs of packages for mounting a semiconductor device numerous different attempts have been made to provide connections between the semiconductor element mounted in the package and an external circuit with a minimum degradation of the various performance characteristics of the semiconductor element. To that end many kinds of semiconductor packages have been provided in the prior art.

For instance, U.S. Pat. No. 3,784,884 discloses a semiconductor package having very low parasitic inductance and capacitances associated with the leads thereof. More particularly, the semi-conductor element is fixedly mounted substantially at the center of a metal header by the intermediary of an insulator having a low thermal resistance such as beryllia. On the metal header are also provided two bonding rails which are disposed in parallel to each other so as to place the beryllia insulator therebetween. In addition, an alumina insulator is fixedly mounted on the peripheral portion of the header, which has a rectangular aperture therein. Two metal lead members, a base lead member and a collector lead member are provided on the alumina insulator via metallization layers. And a sealing ring is provided on the alumina insulator for effecting hermetic seal. A metal lid is welded to the sealing ring.

However, in such a package, since the alumina insulator is directly attached to the header, the occurrence of a large mechanical strain caused by the difference in a thermal expansion coefficients therebetween cannot be avoided. Especially, in the case of transistors for high-power use, a chip configuration of a semiconductor element becomes more elongated as the output power becomes higher, and accordingly, the width of the metallization layers on the alumina insulator as measured in the direction parallel to the semiconductor element is increased. Therefore, in the transistors for high-power use, it is desirable to reduce the parasitic capacitance produced between the metallization layers and the metal header by narrowing the width of the alumina insulator frame, by reduce the area of the metallization layers, or by forming a cavity section in the lower portion of the alumina insulator to provide an air gap and thereby effectively reducing the dielectric constant of the alumina insulator. However, in such a structure the mechanical strength of the apertured alumina insulator tends to be necessarily weakened, so that the influence of the mechanical strain caused by the difference in the thermal expansion coefficient between the metal header and the apertured alumina insulator upon the package would become a serious problem. In addition, in order to make a semiconductor device applicable to high-power and high-frequency use, it is also desirable to mount a matching circuit element such as a MOS chip capacitor on the input side rail by broadening the width of the rail. Furthermore, in order to make a semiconductor element operate efficently, it is desirable to design the input side and the output side to be capacitive and inductive, respectively. To this end, it has been general practice in semiconductor package construction, to enlarge the bonding area between the metallization layer provided on the input side and the base lead member to form a capacitive parasitic element, and to reduce the bonding area between the metallization layer provided on the output side and the collector lead member is reduced to form an inductive parasitic element. The impedances of these parasitic elements are desirably low, especially in a high-frequency region, for instance, in the case of operations at 4 GHz or higher. On the contrary, the parasitic elements produced by the metallization layers on the opposite sides may sometimes unstabilize the properties of the semiconductor element. In addition, if the impedance of the parasitic element is large, as the case of providing the aforementioned internal matching circuit, the design of the circuit would become very difficult. Furthermore, the MOS chip capacitor for the internal matching circuit formed on the rail is also liable to produce cracks in response to a temperature change after the mounting of the chip due to the difference in the thermal expension coefficient between the chip and the rail, if the MOS chip capacitor is made of silicon. Consequently, during the manufacturing process of the package, and at the time when the header is mounted on a heat radiation plate by screws after the semiconductor element has been mounted, cracks would arise at various positions, so that air-tightness is liable to be degraded, and thus serious problems exist with respect to production yield and reliability of the packages.

These problems become more serious in case where a package is large-sized for high-power use, in case where a package is large-sized for providing an internal matching circuit, and in case where impedances such as the capacitance of parasitic elements on the input and output sides are reduced.

It is an object of the present invention to provide a highly air-tight semiconductor device.

It is object of the present invention to provide a large-sized semiconductor air-tight package having a structure suitable for containing an internal matching circuit therein.

It is another object of the present invention to provide an air-tight package having a low parasitic capacitance that is suitable for high-power and high-frequency operations.

The semiconductor device of the present invention includes a small-sized metal header having a good thermal conductivity and a large thermal expansion coefficient. A member having a thermal expansion coefficient of the same order as that of an apertured insulator for mounting a lead is interposed between the metal header and the apertured insulator to avoid direct bonding therebetween, thereby preventing the generation of cracks. Air tightness and production yield of the packages can thus be improved.

The metal header is sufficiently small in size such that only a semiconductor element holding plate which requires heat dissipation can be mounted thereon. This metal header supports at its upper fringe portion an apertured member having a penetrating aperture sealed along the aperture. Furthermore, an insulative outer frame having a thermal expansion coefficient of the same order as that of the apertured member is supported on the peripheral portion of the apertured member. A lid member for sealing is bonded onto the outer frame, such that an air-tight package having a basic construction is obtained.

Now the present invention will be described in greater detail with reference to the accopanying drawings, in which:

FIG. 1A is a cross-section view showing a semiconductor device in the prior art, FIG. 1B is a plan view showing an interior of the package in FIG. 1A, (the scale is not identical to FIG. 1A), FIG. 2A is a cross-section view showing a semiconductor device according to the present invention, FIG. 2B is a plan view showing an interior of the package in FIG. 2A, and FIGS. 3, 4 and 5, respectively, are cross-section views showing other embodiments of the present invention.

A semiconductor device in the prior art such as disclosed in U.S. Pat. No. 3,784,884 is illustrated in FIGS. 1A and 1B, in which two parallel rectangular protrusions or rails 2 and 3 are provided in a central region of a metal header 1 made of a material having a good thermal conductivity such as, for example, silver or copper. Between rails 2 and 3, on the metal header 1 is bonded a semi-conductor holding plate 4 for holding an element. This plate is made of insulative material having a good thermal conductivity such as, for example, beryllia ceramic. The semiconductor holding plate 4 has a metallization layer 5 applied on its upper surface, which serves as a mounting surface for a semiconductor element 6. An apertured alumina insulator 7 is mounted on metal header 1 for mounting terminals. Insulator 7 is adapted to surround the two rails 2 and 3, and a pair of metallization layers 8 and 9 serving as terminal mounting conductive layers are applied on a part of the alumina insulator 7. Metallization layers 8 and 9 are conductive layers to be used for input and output connections, and since their configurations can be arbitrarily selected, they can also perform the function of adjusting the impedance matching with an external circuit. A frame-like insulative substrate 10 is provided on the metallization layers 8 and 9 for engaging with a metal lid 18 which hermetically seals the package.

To effect electrical connections between the semiconductor element 6 mounted on the metallization layer 5 and the external circuit, for instance, in the case where the semiconductor element 6 is a bipolar transistor, the metallization layer 5 is connected to the collector of the transistor 6, the metallization layer 5 is connected to the metallization layer 9 by bonding with a plurality of bonding wires 11, and an external extension lead 12 as an output connection to the external circuit is led out from metallization layer 9.

On the input side, the connection between the input electrode of the semiconductor element 6 and the metallization layer 8 is effected directly with a plurality of bonding wires 13, and the metallization layer 8 is connected to the external circuit through an external extension lead 14. Since the metal header 1 is conductive, the electrodes are to be grounded connected to the top surfaces of the rails 2 and 3 with thin metal wires 15 and 16, respectively. The metal lid is hermetically sealed on the frame-like insulative substrate 10 by the intermediary of a metallization layer 17.

In this prior art semiconductor element package, since the header 1 and the alumina insulator 7 are directly bonded to each other, a mechanical strain caused by the difference in the thermal expansion coefficients therebetween would be applied to the alumina insulator 7. The thermal expansion coefficient of silver and alumina are, respectively, about $190 \times 10^{-7}$ deg$^{-1}$ and $70-77 \times 10^{-7}$ deg$^{-1}$ at a temperature range of 20°–800° C. The insulator 7 is desirably formed to have a minimum frame width in order to reduce the parasitic capacitance distributed between the metallization layers 8 and 9 and the metal header 1, but if the frame width is reduced, the insulator 7 would be greatly affected by the afornmentioned mechanical strain, resulting in cracks or the like, and thereby the reliability as an air-tight package would be lowered.

These deficiencies in the prior semiconductor packages are overcome in the semiconductor package of the present invention which is now described with reference to FIGS. 2A, 2B, 3, 4, and 5.

In the embodiment of the invention illustrated in FIGS. 2A and 2B, elements which are the same as those shown in FIGS. 1A and 1B are given the same reference numerals, and description of these component parts will be omitted. In the embodiment of FIG. 2A, a metal header 21 is mounted on a stem 24, and the metal header 21 is reduced in sized to such an extent that it is somewhat larger than the element holding insulator 4.

On the exposed upper peripheral surface portion of this small-sized metal header 21, which is made of a material such as copper or silver, is bonded an apertured member 25 made of a material having a thermal expansion coefficient that is approximately the same as the thermal expansion coefficient of the apertured insulator 7 so that an aperture 250 of the apertured member 25 is disposed at the exposed upper peripheral surface portion of metal header 21. The element holding plate 4 is bonded on the exposed upper central surface portion of the metal header 21, and protrusions or rails 22 and 23 are bonded on the upper surface of the apertured member 25. The lead mounting apertured insulator 7 is bonded on the peripheral portion of the apertured member 25.

After this construction has been made, metallization layers 8 and 9 are applied on the apertured insulator 7 and the frame-like insulative substrate 10 for bonding the hermetic seal lid 181 of the package is applied to metallization layers 8 and 9. External extension leads 14 and 12 are respectively bonded on the metallization layers 8 and 9.

A semiconductor element 6 is mounted on a metallization layer 5 for a collector on the element holding plate 4 through a known method. Furthermore, a passive element 26 for an internal matching circuit consisting of a MOS chip capacitor or the like is mounted on the rail 22. Electrical connections between the semiconductor element 6 and a metallization layer 261 of the passive element 26 and between the respective metallization layers are effected with a plurality of bonding wires in a similar manner to the prior art device, and the bonding wires 27 connecting the semiconductor element 6 and the passive element 26 and the bonding wires 28 connecting the passive element 26 and the input lead mounting metallization layer 8 have the functions of inductance elements in an internal matching circuit.

Since the semiconductor element 6 is mounted on the element holding plate 4 bonded on the metal header 21, the generated heat can be dissipated very efficiently in a similar manner to the prior art device. When the apertured insulator 7 is made of alumina, it is desired that the apertured member 25 be formed of Kovar or molybdenum. Kovar is a trademark for an alloy containing approximately 29% nickel, 17% cobalt and 0.3% manganese, the balance being essentially iron. The thermal expansion coefficient of Kovar and molybdenum is approximately $70$–$75 \times 10^{-7}$ deg$^{-1}$ and $75 \times 10^{-7}$ deg$^{-1}$ at a temperature range of 20°–800° C. Giving this condition to the package, air-tightness for the semiconductor element 6 within the apertured insulator 7 is assured, even if the mechanical strength of the apertured insulator 7 is lowered, or the configuration of the package is large-sized, since the stress caused by the difference in thermal expansion coefficients between the metal header 21 and the apertured insulator 7 can be mitigated owing to the apertured member 25. The unwanted generation of cracks and degradation of air-tightness will accordingly not occur in this construction.

In the embodiment of the present invention illustrated in FIG. 3, component parts which are identical to those shown in FIGS. 1 and 2 are given like reference numerals. In this embodiment, in order to reduce parasitic capacitances produced by the input and output lead mounting metallization layers 8 and 9, cavity portions 71 and 72 are provided in the lower portion of an apertured insulator 70. Although the mechanical strength of the apertured insulator 70 is weakened by employing this configuration, this insulator structure is very effective because the stress generated by thermal expansion is not directly exerted upon the apertured insulator 70.

In an exemplifying embodiment of the invention, the header 21 is copper plated with gold in size of 5.7 mm in length, 3.2 mm in width at bottom and 0.6 mm in height. The stem 24 is copper, and is 10 mm in length, 10 mm in width and 1.6 mm in height. The apertured member 25 having a rectangular opening 250 measuring 4.7 mm by 1.7 mm is is Kovar and measures 10 mm by 10 mm with a thickness of 0.3 mm. The apertured member 25 is brazed to copper header 21. The two protrusions 22 and 23 are Kovar, and are brazed to the apertured member 25 along rectangular opening 250. The thermally conductive ceramic insulator 4 is made of beryllia, and is brazed to copper header 21 between two protrusions 22 and 23. Microwave transistor 6 may be attached by known die bonding methods to metal film 5. The apertured insulator 70 having a cavity height of 0.76 mm is made of alumina. In size insulator 70 is 2.2 mm in upper surface width, 1.0 mm in bottom width and 1.17 mm in height, and is brazed to the peripheral portion of the apertured member 25. The frame-like insulative substrate 10 is alumina and has a size of 10 mm in length, 0.6 mm in frame width and 0.38 mm in height. Substrate 10 is brazed to apertured insulator 70. The sealing lid 181 is alumina and is 10 mm in length, 8 mm is width and 0.38 mm in thickness. Lid 181 is brazed to the frame-like insulative substrate 10. The gap distance between the apertured member 25 and the stem 24 is 0.3 mm. The profile size of the package is 10 mm in length, 10 mm in width and 4.1 mm in height.

With the foregoing typical structure, the parasitic capacitances between the metallized layers 8 and 9 and the apertured member 25 can be significantly reduced. In an embodiment described above with a metallized layer of 2.2 mm$\times$4 mm in area, the parasitic capacitance without a cavity was measured at 0.9 pF, whereas that with a cavity was measured at about 0.47 pF.

When the parasitic capacitance is determined at the same value, the package size of the present invention may be enlarged to about three times that of the conventional structure.

Figure 4:
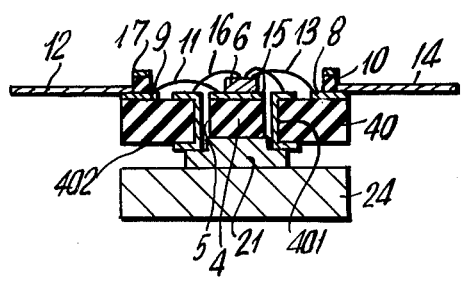

Still another embodiment of the present invention is illustrated in FIG. 4, in which component parts identical to those shown in FIG. 3 are given like reference numerals. Regardless of whether or not the internal matching circuit is necessary, the proposed structure is effective in the case of realizing a semiconductor element package in which the impedances of parasitic elements such as a parasitic capacitance are small. More particularly, an apertured member 40 is made of alumina ceramic and on its surface are formed metallization layers 8, 9, 401 and 402. A metallization layer is not formed on the lower surface region of the apertured member 40 at the positions opposite to the metallization layers 8 and 9 for extending leads 14 and 12. Consequently, the parasitic capacitances produced between the metallization layers 8 and 9 and the metal header 1 in the prior art structure of FIG. 1 can be greatly reduced.

Figure 5:
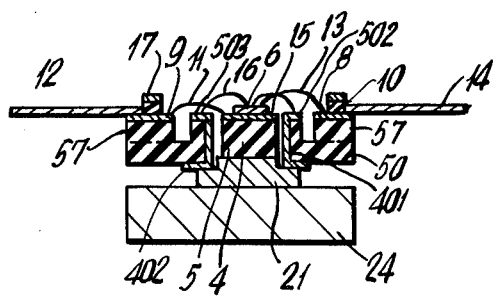

A further modification of the embodiment shown in FIG. 4 is illustrated in FIG. 5, in which an apertured insulator 57 and protrusions 502 and 503 are formed on the apertured member 50. The protrusions 502 and 503 are separated from each other, so that the parasitic capacitances caused by the metallized layers 8 and 9 can be further reduced.

As will be apparent from the above description, for the apertured member according to the present invention, either a metal member or a ceramic member can be selected. In addition, the metallization layers 401 and 402 on the ceramic member 40 or 50 in the embodiment of FIG. 4 or FIG. 5 are formed for the purpose of electrically connecting the protrusions 502 and 503 with the metal header 21 so as to be associated with a minimum inductance, and bonding the ceramic member 40 or 50 to the metal header 21. Needless to say, a metal lid can be substituted for the alumina lid 181.

Either metal or ceramic can be used for the protrusions 22 and 23 in the embodiments of FIG. 2 or else these protrusions can be formed integrally with the apertured member 25. In the case where the apertured member 25 is made of ceramic material and formed integrally with the protrusions 22 and 23, it is desirable to form a metallization layer over the entire surface.

According to the present invention, it will be appreciated that a semiconductor element package in which the impedances of the parasitic elements such as a parasitic capacitance are very small and an internal matching circuit is easily formed can be realized even if the semiconductor element package is large-sized for the purpose of providing an internal matching circuit or converting into a high-power type. In addition, since the performance of the semiconductor element package with respect to reliability for cracks can be also substantially improved, a semiconductor element package that is most particularly suitable especially for a high-power and high-frequency semiconductor element is provided.

What is claimed is:

1. A semiconductor device comprising a metal header, a first thermally conductive insulator member attached to said metal header, a semiconductor carried by said first insulator member, an apertured member having an opening and being attached to said metal header, said opening being smaller than the upper surface of said metal header, a second insulator member attached to a peripheral portion of said apertured member, said second insulator member having an opening therein exposing a surface of said apertured member and said first insulator member, said second insulator member having first and second metallic regions, and first and second metallic lead members respectively connected to said first and second metallic regions and extending externally of the package.

2. The semiconductor device as claimed in claim 1, further comprising a heat sink member thermally connected to the bottom of said metal header and spaced from the projected portion of said apertured member with a gap therebetween.

3. The semiconductor device as claimed in claim 1, in which said apertured member includes a conductive metal member having said aperture and an insulative supporting member, said conductive metal member being attached at a part of its bottom surface to said peripheral portion of said metal header and outwardly projecting beyond the periphery of said metal header, said insulative supporting member being attached to the upper surface of the projected portion of said conductive metal member.

4. The semiconductor device as claimed in claim 3, wherein said insulative supporting member has a cavity positioned between said conductive metal member and said external lead members.

5. The semiconductor device as claimed in claim 1, in which said apertured member is made of a dielectric member having said aperture and a metallized layer covering the inner wall of said aperture and upper and lower surfaces adjacent to said aperture, said metallized layer at the lower surface adjacent to said aperture being connected to said peripheral portion of said metal header.

6. A semiconductor device comprising a metal header having an upper and a bottom face, an insulator plate disposed on the central portion of said upper face of said metal header, a semiconductor element with a plurality of electrodes fixed on said insulator plate, a metal supporting member of a size larger than that of said upper face of said metal header and having an aperture of a size smaller than that of said upper face of said metal header, said metal supporting member being electrically and mechanically connected to the peripheral portion of said upper face of said metal header at the periphery of said aperture thereof and projecting outwardly beyond the periphery of said upper face of said metal header, an insulative supporting member disposed on the peripheral portion of an upper surface of said metal supporting member, and a plurality of external lead members fixed to said insulative supporting member and extending outwardly beyond the fringe of said metal supporting member.

7. The semiconductor device of claim 6, further comprising a heat sink member thermally coupled to said bottom face of said metal header, said heat sink member being separated with a gap from the projected portion of said metal supporting member.

8. The semiconductor device of claim 6, further comprising a conductive metal protrusion formed on said upper face of said metal supporting member on the inside of said insulative supporting member.

9. The semiconductor device of claim 6, further comprising means for electrically connecting selected electrodes of said semiconductor element to said external lead members, and means for electrically connecting another electrode of said semiconductor element to said metal supporting member.

10. The semiconductor device of claim 6, wherein said insulative supporting member has an upper surface to which said external lead members are fixed and a bottom surface having a smaller area than the upper surface fixed to said metal supporting member.

11. The semiconductor device of claim 8, further including impedance matching means coupled to said protrusion.

12. The semiconductor device of claim 6, wherein the thermal expansion coefficient of said metal supporting member is similar to that of said insulative supporting member.

13. A semiconductor device comprising a metal header having an upper and a bottom face, an insulative member on a central portion of said upper face of said metal header, an insulative supporting body having an aperture of a size smaller than that of said upper face of said metal header, said insulative supporting body being fixed to the peripheral portion of said upper face of said metal header at the periphery of said aperture thereof and projecting outwardly beyond the periphery of said upper face of said metal header, a plurality of external leads mechanically fixed to the upper surface of the projecting portion of said insulative supporting body and extending externally from said insulative supporting body, and a semiconductor element with a plurality of electrodes fixed to said insulative member.

14. The semiconductor device of claim 13, further including a heat sink member thermally coupled to said bottom face of said metal header and spaced with a gap from said projecting portion of said insulative supporting body.

15. The semiconductor device of claim 13, wherein said insulative supporting body includes a first portion supporting said external leads, a second portion adjacent to said aperture, and a third portion positioned between said first portion and said second portion and having a thickness less than that of said first and second portions.

16. The semiconductor device of claim 13, further comprising means for electrically connecting one of said electrodes of said semiconductor element to said metal header, said connecting means including a metallized layer formed on the inner wall of said aperture of said insulative supporting body.

* * * * *